US009935577B2

(12) United States Patent
Bito et al.

(10) Patent No.: US 9,935,577 B2
(45) Date of Patent: Apr. 3, 2018

(54) SEMICONDUCTOR DEVICE AND FAULT DETECTING METHOD

(71) Applicant: Renesas Electronics Corporation, Tokyo (JP)

(72) Inventors: Katsutoshi Bito, Tokyo (JP); Daisuke Iijima, Tokyo (JP); Yuji Takehara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 31 days.

(21) Appl. No.: 15/098,052

(22) Filed: Apr. 13, 2016

(65) Prior Publication Data
US 2017/0003337 A1    Jan. 5, 2017

(30) Foreign Application Priority Data

Jun. 30, 2015 (JP) .................................. 2015-130666

(51) Int. Cl.
*H02P 29/024* (2016.01)
*H01L 29/739* (2006.01)
(Continued)

(52) U.S. Cl.
CPC ............ *H02P 29/024* (2013.01); *H01L 23/36* (2013.01); *H01L 27/0255* (2013.01); *H01L 27/0664* (2013.01); *H01L 29/7395* (2013.01); *H01L 29/866* (2013.01); *H02M 7/537* (2013.01); *H02P 27/08* (2013.01); *H02P 29/0241* (2016.02); *H03K 19/018507* (2013.01); *G01R 31/30* (2013.01); *H01L 23/3735* (2013.01); *H01L 2224/48091* (2013.01);
(Continued)

(58) Field of Classification Search
None
See application file for complete search history.

(56) References Cited

U.S. PATENT DOCUMENTS 5,721,455 A * 2/1998 Takashita ................ H01L 23/34
257/177
8,040,708 B2 * 10/2011 Sato ..................... H01L 23/4952
323/282
(Continued)

FOREIGN PATENT DOCUMENTS

JP    2011-196703 A    10/2011

*Primary Examiner* — Melissa Koval
*Assistant Examiner* — Nasima Monsur
(74) *Attorney, Agent, or Firm* — McGinn IP Law Group, PLLC.

(57) ABSTRACT

A method of detecting a fault of a semiconductor device including a power device mounted on a metal base and a drive circuit for driving the power device, the method detecting a fault of the semiconductor device beforehand based on an increase in thermal resistance between the metal base and the power device. A state of the power device is measured immediately before and after the power device is driven by the drive circuit. A temperature difference of the power device before and after driving is calculated according to the result of measurement. An increase in thermal resistance between the metal base and the power device is detected based on the temperature difference and an amount of electricity inputted to the power device in the driving period, and a fault of the semiconductor device is detected beforehand according to the increase.

18 Claims, 14 Drawing Sheets

(51) Int. Cl.
- *H01L 29/866* (2006.01)
- *H01L 27/06* (2006.01)
- *H01L 27/02* (2006.01)
- *H02P 27/08* (2006.01)
- *H02M 7/537* (2006.01)
- *H03K 19/0185* (2006.01)
- *H01L 23/36* (2006.01)
- *G01R 31/30* (2006.01)
- *H01L 23/373* (2006.01)
- *H02M 7/5387* (2007.01)
- *H02M 1/32* (2007.01)

(52) U.S. Cl.
CPC .............. *H01L 2224/48227* (2013.01); *H01L 2924/19107* (2013.01); *H02M 7/53871* (2013.01); *H02M 2001/327* (2013.01)

(56) References Cited

U.S. PATENT DOCUMENTS

| | | | |
|---|---|---|---|
| 2003/0076232 A1* | 4/2003 | Sato | H02M 7/00 340/679 |
| 2011/0181255 A1* | 7/2011 | Hashimoto | H02M 3/1588 323/272 |
| 2013/0222048 A1* | 8/2013 | Souma | H01H 37/761 327/525 |

* cited by examiner

SEMICONDUCTOR DEVICE AND FAULT DETECTING METHOD

CROSS-REFERENCE TO RELATED APPLICATIONS

The disclosure of Japanese Patent Application No. 2015-130666 filed on Jun. 30, 2015 including the specification, drawings and abstract is incorporated herein by reference in its entirety.

The present invention relates to a semiconductor device and a fault detecting method and is particularly useful for detecting a fault of a power semiconductor device beforehand.

BACKGROUND

In a module including power semiconductor devices (power devices) such as a motor driving power module, a fault during an operation of a component like a power device may frequently cause strong influence. Thus, the component is replaced according to a life prediction before the fault actually occurs.

Japanese Unexamined Patent Application Publication No. 2011-196703 discloses a power cycle-life predicting method in an IGBT module including an insulated gate bipolar transistor (IGBT) as a power device. A power-cycle life curve obtained from a conducted power cycle test is compared with a value measured using a temperature sensor mounted in the IGBT module, allowing calculation of a module life. In a power cycle test, thermal stress is generated to increase or reduce the junction temperature of the IGBT in a relatively short time, and then a change of properties is observed to obtain a power-cycle life curve before a break occurs. Japanese Unexamined Patent Application Publication No. 2011-196703 focuses on the power-cycle life curve that includes a plurality of straight lines varying in inclination depending on the temperature range with an inflection point. A life is predicted with reference to the inflection point, improving the accuracy of prediction.

As a result of examination of Japanese Unexamined Patent Application Publication No. 2011-196703 by the inventors, another problem is found as follows:

In the invention disclosed in Japanese Unexamined Patent Application Publication No. 2011-196703, focusing on the inflection point of a power-cycle life curve can improve the accuracy of life prediction. However, a life is predicted according to the number of power cycles and thus in an IGBT module according to the present invention, maintenance such as replacement of a module is performed with a sufficient margin in consideration of a thermal stress in an actual operation and a difference in thermal stress in a power cycle test. Consequently, the module is replaced long before a fault actually occurs. Specifically, an IGBT module that receives a thermal stress as large as that of a power cycle test has a proper margin but this margin is excessive for an IGBT module that receives a light load leading to a small thermal stress.

A solution to this problem will be described below. Other problems and new features will become apparent from a description of the specification and the accompanying drawings.

An embodiment will be described below.

A method of detecting a fault of a semiconductor device including a power device mounted on a metal base and a drive circuit for driving the power device, the method detecting a fault of the semiconductor device beforehand based on an increase in thermal resistance between the metal base and the power device. A state of the power device is measured immediately before and after the power device is driven by the drive circuit. A temperature difference of the power device before and after driving is calculated according to the result of measurement. An increase in thermal resistance between the metal base and the power device is detected based on the temperature difference and an amount of electricity inputted to the power device in the driving period, and a fault of the semiconductor device is detected beforehand according to the increase.

An effect obtained by the embodiment will be simply discussed below.

A state can be directly detected immediately before a normal mounting state of the power device is deteriorated so as to cause a fault. Thus, the life of the semiconductor device can be substantially increased. This only requires a margin smaller than a margin to be kept for a fault period predicted by life prediction based on a power cycle test, thereby extending a maintenance cycle for replacement and so on.

DETAILED DESCRIPTION

Figure 1:
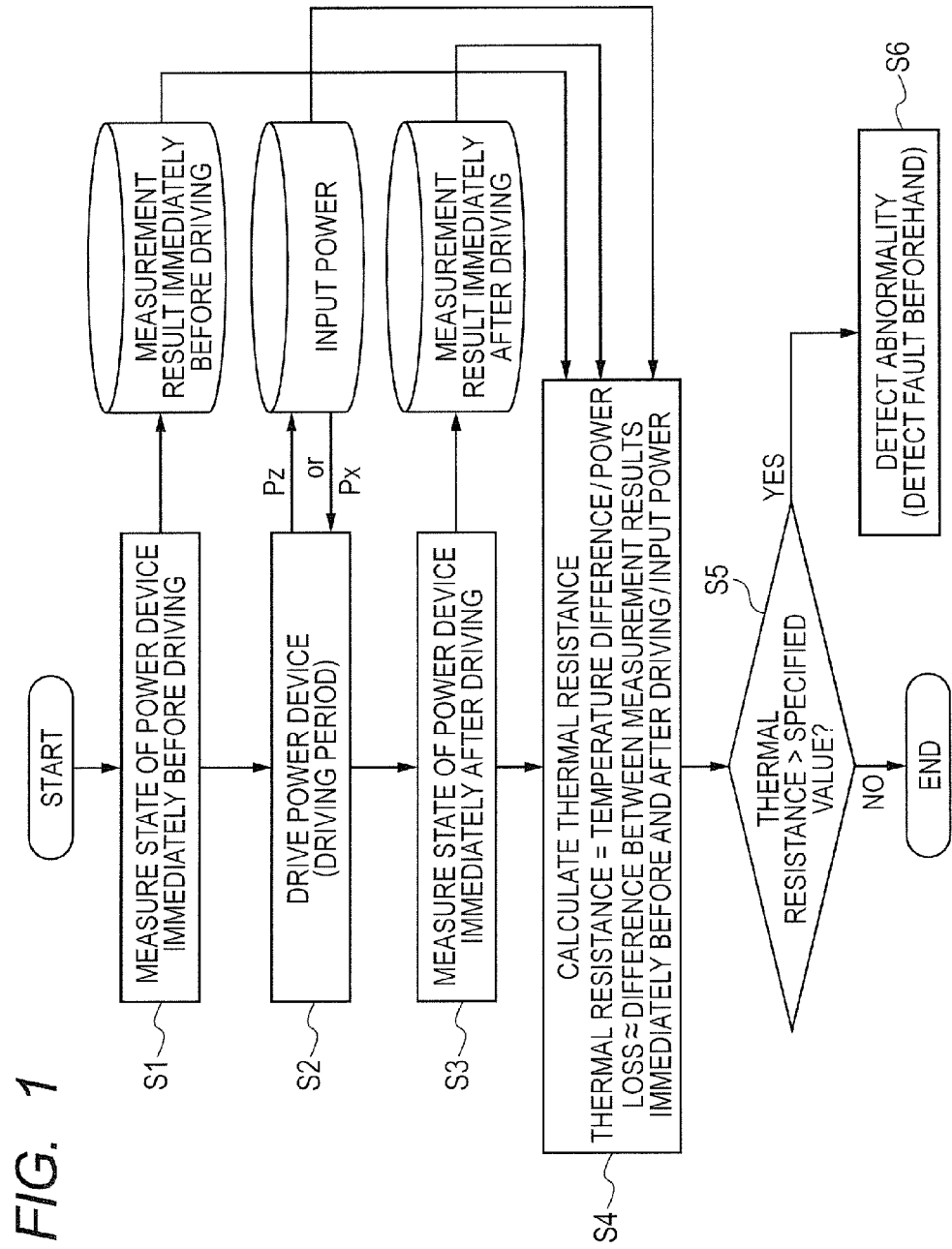
FIG. 1 is a flowchart showing a method of detecting a fault of a semiconductor device (power module) according to a first embodiment.

Embodiments will be specifically described below. In all drawings illustrating aspects for implementing the present invention, elements having the same function are indicated by the same reference numerals and the repeated explanation thereof is omitted.

First Embodiment

A representative embodiment is a method of detecting a fault of a power module according to an increase in thermal resistance.

Figure 2:
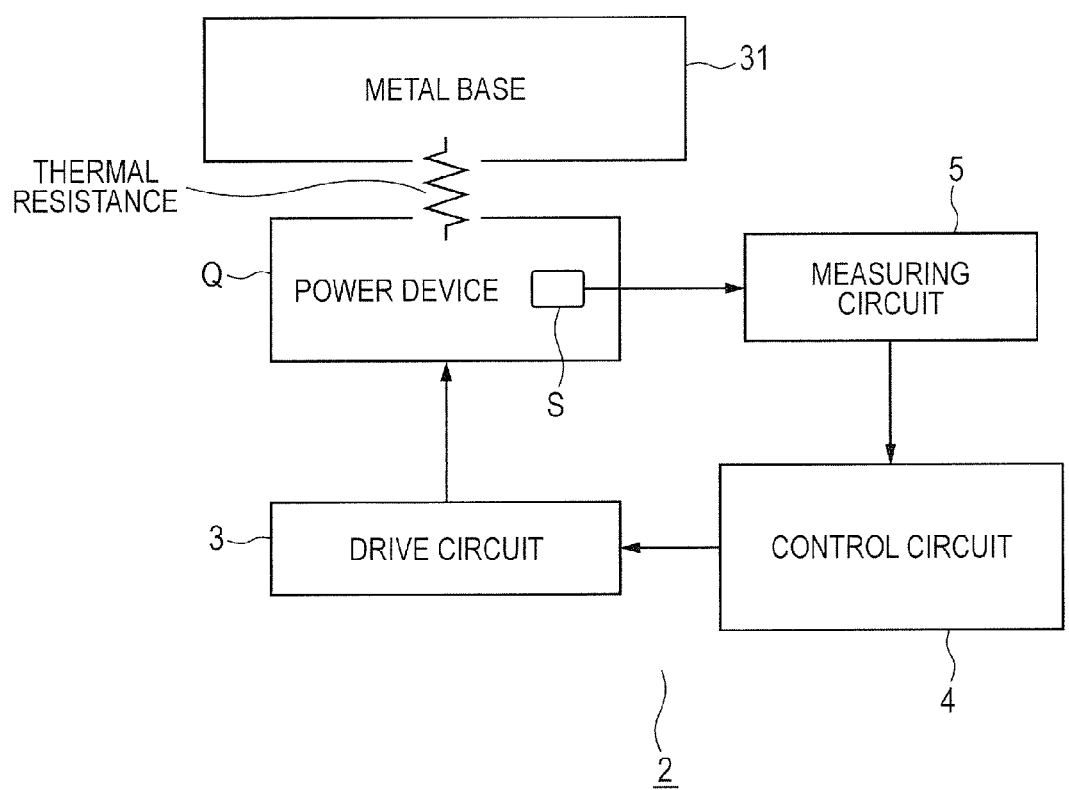
FIG. 2 is a schematic block diagram showing the configuration of the semiconductor device (power module) that is a fault detection target.

FIG. 1 is a flowchart showing a method of detecting a fault of a semiconductor device (power module) according to a first embodiment. FIG. 2 is a schematic block diagram showing the configuration of a target power module of fault detection.

A power module 2 includes a power device Q mounted on a metal base 31 for thermal dissipation and a drive circuit 3 for driving the power device Q. The power device Q uses power supplied from a power supply (not shown) and drives a load (not shown) with high power in response to a driving signal inputted from the drive circuit 3. In the power module 2, a circuit for driving a load is configured using at least one power device Q according to a used driving system. The power device Q is, for example, an IGBT, a metal oxide semiconductor field-effect transistor (MOSFET), a bipolar transistor, or other devices that can drive the load with high power in response to the driving signal. The power device Q generates heat by changing a power loss changes to heat when the load is driven. The power device Q is mounted in contact with the metal base 31 so as to dissipate heat, so that heat generated by a power loss is transferred to the metal base 31 and is released therefrom.

In this case, a power loss is power that is inputted to the power device Q from a power supply (not shown) and is converted to heat in the power device Q without being supplied to the load. For example, in a quite simple model, a power loss Ploss is calculated as Ploss=Pin×(1−η) where Pin indicates input power and η indicates load efficiency. This equation is obvious because the load efficiency η is defined as the ratio of power supplied to the load out of the input power Pin from the power supply. In other words, when a change of the load efficiency η is sufficiently small, the power loss Ploss is proportionate with the power Pin inputted to the power device.

A thermal resistance exits between the power device Q and the metal base 31. The power device Q is configured such that a semiconductor element is mounted on a package substrate. Factors for determining a thermal resistance include a bonding state of the semiconductor element and the package substrate in the power device Q. In the case of a vertical semiconductor element, particularly, electrodes provided on the back side of a semiconductor substrate are bonded to metal wires on the package substrate by soldering or the like so as to satisfactorily keep electrical conductivity and thermal conduction. Furthermore, the package of the power device Q and the substrate of the power module 2 are bonded by soldering or the like, which may be included in the factors for determining a thermal resistance. For a fault at the end of the life of the power module 2, a fault mode is known in which solder is deteriorated by a power cycle and then is finally peeled off. The related art disclosed in Japanese Unexamined Patent Application Publication No. 2011-196703 predicts a life in the fault mode according to the power cycle. Instead of the related art, the inventors have devised a method of detecting a fault of the power module 2 beforehand based on the detection of an increase in thermal resistance between the power device Q and the metal base 31.

The method of detecting a fault of the power module 2 can be achieved by a flowchart shown in FIG. 1.

The state of the power device Q is measured (S1, S3) immediately before and after the power device Q is driven (S2) by the drive circuit 3 in a driving period. A temperature difference ΔT before and after the driving of the power device Q is calculated from the measurement result (S4). An increase in thermal resistance between the metal base 31 and the power device Q is detected based on the temperature difference ΔT and power (input power) Px and Pz inputted to the power device Q in the driving period (S5). A fault of the power module 2 is detected beforehand based on an increase in thermal resistance between the metal base 31 and the power device Q (S6).

In this case, the state of the power device Q is optionally determined if a parameter depends on a temperature of the power device Q. The parameter may be a temperature or an electrical parameter of the power device Q. For example, if the power device Q is an IGBT, the parameter may be an on voltage, an internal diode voltage, or a threshold voltage. In the case of a MOSFET, the parameter may be an on voltage or a threshold voltage. In the case of a bipolar transistor, the parameter may be an on voltage, a base-emitter forward voltage or a current amplification.

The driving of the power device Q by the drive circuit 3 (S2) is optional if the power loss of the power device Q can be measured or estimated in the driving period. For example, the power device Q is driven by a driving signal having a predetermined amplitude, frequency, and duty ratio in a predetermined period (driving period), which can determine the input power Px to the power device Q. If the driving period is a relatively short period, a change of the load and a change of the load efficiency are expected to be sufficiently small in the period. Thus, the power loss of the power device Q is proportionate to the input power Px. In the flowchart of FIG. 1, the present embodiment is expressed by the arrow of the input power Px to the driving of the power device (S2). The input power Pz can be also determined by measuring power inputted to the power device Q in any period during which the drive circuit 3 is driven by the power device Q (S2). The inputted power can be calculated by the product of a voltage applied to the power device Q and a current passing through the power device Q. If the power is calculated in a sufficiently short period, a change of the load and a change of the load efficiency are expected to be sufficiently small in the period. Thus, the power loss of the power device Q is proportionate to the input power Pz. In the flowchart of FIG. 1, the present embodiment can be expressed by the arrow of the input power Pz outputted from the driving of the power device (S2).

The calculation of a thermal resistance does not require quantitative calculation of a thermal resistance between the power device Q and the metal base 31 as long as a thermal resistance exceeding a specified value can be detected along with the downstream decision step (S5). A thermal resistance θ between the power device Q and the metal base 31 is calculated by dividing the temperature difference ΔT between the power device Q and the metal base 31 by the power loss Ploss of the power device Q. θ=ΔT/Ploss The power device Q has temperatures T1 and T2 before and after driving. If the metal base 31 has a sufficiently large thermal capacity and is kept at a constant temperature before and after driving, the temperature is equal to the temperature T1 of the power device Q before driving. Thus, the thermal resistance θ can be determined using a temperature difference T2−T1 of the power device Q before and after driving. In this case, the temperature difference ΔT can be determined by directly measuring the temperatures T1 and T2 using a temperature sensor provided in or next to the power device Q. Instead of measuring the temperatures T1 and T2 of the power device Q, the temperature difference ΔT can be calculated from the electrical characteristics of the power device Q. Since most of the electrical characteristics of the semiconductor elements have temperature dependence, the temperature difference ΔT can be estimated or calculated by measuring the electrical characteristics of the power device Q before and after driving. At this point, the temperature difference ΔT does not need to be quantitatively calculated. For example, the temperature difference ΔT may be replaced with a numeric value proportionate to the temperature difference ΔT because it is only necessary to detect that the thermal resistance θ has exceeded the specified value. Most of the electrical characteristics of the semiconductor elements have the term of exp (−kT/q) (where exp is the index of a natural logarithm, k is a Boltzmann constant, q is the charge amount of electrons, and T is an absolute temperature) and thus the temperature difference ΔT=T2−T1 may be replaced with any value calculated from the ratio of electrical characteristics (exp(−kT2/q)/exp(−kT1/q)=exp(−k(T2−T1)/q)).

As shown in FIG. 1, a thermal resistance is calculated (S4) and then the value is compared with the specified value (S5) so as to detect an increase in thermal resistance. This can achieve abnormality detection, that is, a fault can be detected beforehand (S6). The specified value at this point can be empirically or theoretically determined or empirically and theoretically specified values can be used. As described above, if the index indicating a temperature difference is used instead of a temperature difference, an input power is used instead of a power loss, and a numeric value indicating a thermal resistance is calculated instead of a thermal resistance, a specified value corresponding to the numeric value is empirically or theoretically determined or empirically and theoretically specified values are used. This can detect that the thermal resistance θ has exceeded the specified value, without quantitatively calculating the thermal resistance θ.

As shown in FIG. 2, the power module 2 preferably includes a sensor S provided in or next to the power device Q, a measuring circuit 5, and a control circuit 4 in addition to the power device Q, the metal base 31, and the drive circuit 3. The sensor S may be provided only for a parameter that requires measurement or may be used with another sensor provided not for fault detection. If the temperature of the power device Q is measured, the temperature sensor S is provided in the power device Q or in contact with the package of the power device Q. The included temperature sensor is, for example, a junction diode formed on the same semiconductor chip as the power device Q. The formation of the sensor on the same semiconductor chip can correctly measure the junction temperature of the power device Q. In measurement of a current passing through the power device Q, for example, magnetic sensors are mounted which include a giant magneto-resistance (GMR) sensor arranged along a current path. A resistor for measurement or a transformer may be inserted into the current path. The measurement of a voltage applied to the power device Q does not require a special sensor. The measuring circuit 5 is designed for the mounted sensor S and supplies power, e.g., a bias voltage or a bias current to the sensor so as to increase a measured value or convert a level. In a normal operation, the control circuit 4 drives the power device Q through the drive circuit 3 in response to an instruction from the outside. For example, when the load of the power module 2 is a motor, the amplitude, frequency, and duty ratio of the driving signal for driving the power device Q through the drive circuit 3 are adjusted in response to an instruction for changing the rpm of the motor from the outside. The control circuit 4 may have the function of detecting abnormalities such as overcurrent, overvoltage, and overheating. The control circuit 4 of the first embodiment has additional function for fault detection as shown in the flowchart of FIG. 1. The sensor and the measuring circuit that are necessary in the first embodiment may serve as a sensor and a measuring circuit that detect abnormalities such as overcurrent, overvoltage, and overheating.

This can directly detect a state immediately before a fault occurs due to an abnormal mounting state of the power device Q, thereby substantially increasing the life of the semiconductor device (power module 2). Thus, a required margin can be smaller than a margin to be kept for an actual fault period based on life prediction using a power cycle test, thereby increasing a cycle for maintenance such as replacement.

Figure 14:
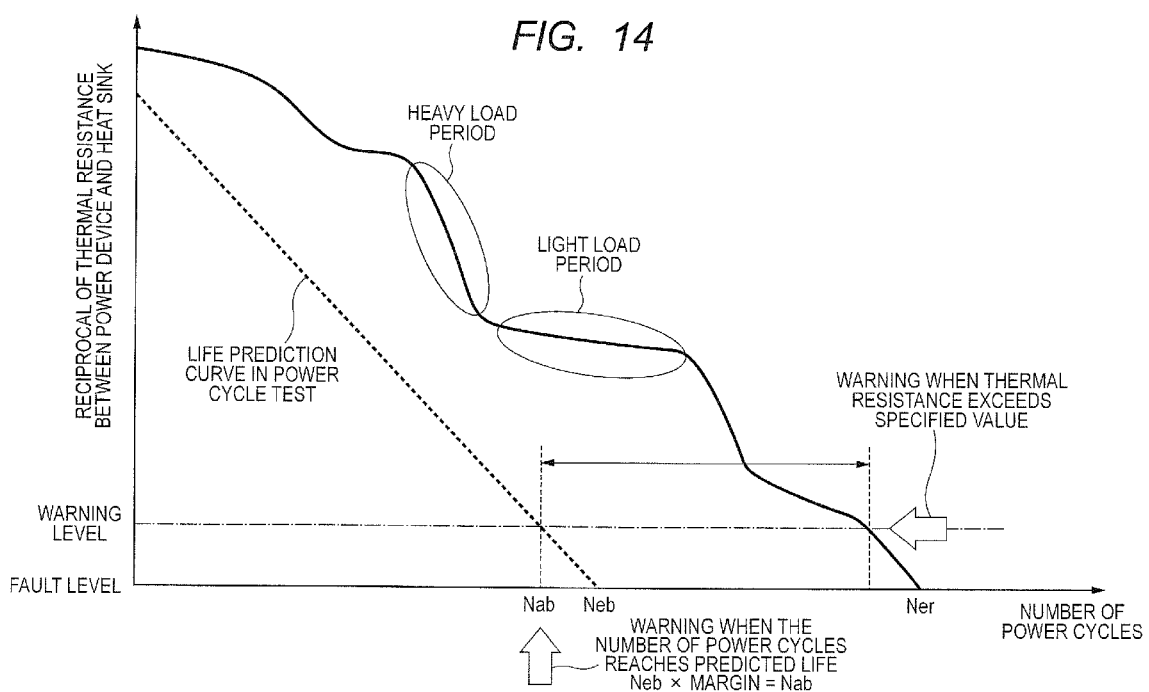
FIG. 14 is an explanatory drawing showing an example of the effect of a fault detecting method of the semiconductor device (power module) according to the first embodiment.

The effect of the method of detecting a fault of the semiconductor device (power module) according to the first embodiment will be more specifically described below. FIG. 14 is an explanatory drawing showing the example of the effect. The horizontal axis indicates the number of power cycles from a time immediately after shipment to the occurrence of a fault while the vertical axis indicates the reciprocal of a thermal resistance between the power device Q and the metal base. A solid line indicates the history of changes in thermal resistance in the actual power module 2 while a broken line indicates a life prediction curve based on a power cycle test. The thermal resistance (solid line) in the actual power module 2 rapidly decreases in a heavy-load period but gradually decreases in a light-load period. Ner denotes the number of power cycles when a fault actually occurs. The life prediction curve (broken line) based on the power cycle test is assumed to have an extremely heavy load all the time. Neb denotes the number of power cycles at the occurrence of a fault. In life prediction based on a power cycle test, a reference number of power cycles Nab is determined by adding a predetermined margin to an estimated number of power cycles Neb at the occurrence of a fault, and then a warning is issued before the fault level. For example, Nab is determined by warning level Nab=Neb× margin where Neb is an estimated power cycle. In Japanese Unexamined Patent Application Publication No. 2011-196703, a life prediction curve is not approximated by a single straight line but is approximated by a plurality of straight lines with inflection points, thereby improving prediction accuracy. However, the prediction is merely made according to the number of power cycles and thus seems to be deviated from the curve (solid line) of deterioration of the actual power module 2 because a load and an operation period are not clear.

In contrast, as described in the first embodiment, an abnormality is detected by detection of an increase in thermal resistance and then a warning is issued. As indicated by both arrows, a warning can be delayed from a warning level Nab based on the life prediction curve determined by a power cycle test. Generally, a heavier load than in a normal operation is assumed in a power cycle test, and thus it is believed that the life prediction curve (broken line) determined by the test typically decreases with a larger angle than that of the curve of deterioration of the actual thermal resistance (solid line), leading to a fault. This can operate the power module 2 until immediately before a fault, thereby increasing the cycle of maintenance such as replacement.

If the curve of deterioration of an actual thermal resistance more rapidly decreases for some reason than a life prediction curve determined by a power cycle test and reaches a fault before the number of power cycles reaches Nab, a fault cannot be detected beforehand to issue a warning in life prediction based on a power cycle test. In contrast, the fault detecting method according to the first embodiment can issue a warning before an actual fault. This is because even if a thermal resistance rapidly increases, whether the thermal resistance has exceeded the specified value is always decided (S5 in FIG. 1) before an actual fault.

Second Embodiment

As a specific embodiment, a power module 2 is, for example, an inverter circuit that controls and drives a load (Load) 12 of a motor or the like.

Figure 3:
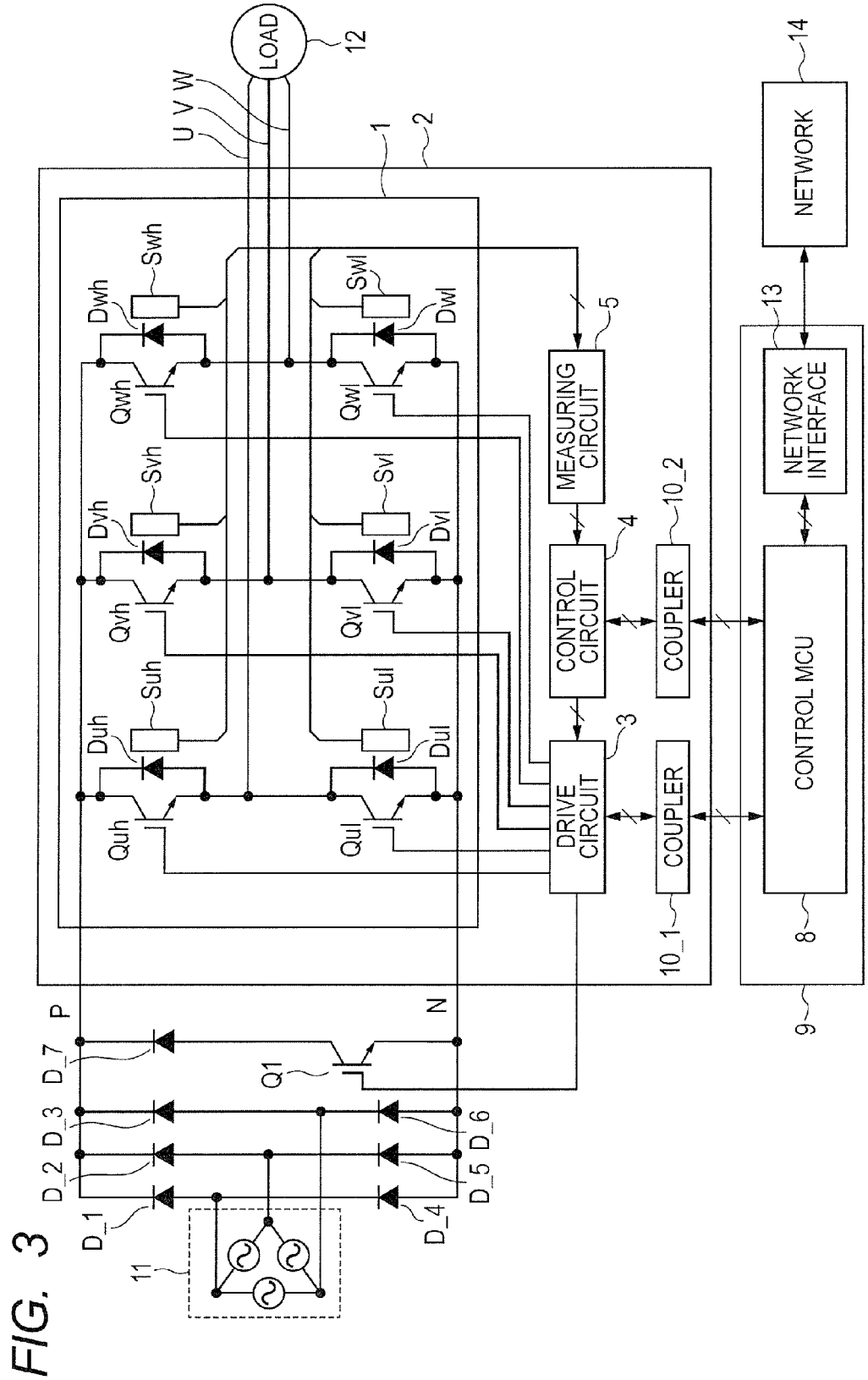
FIG. 3 is a block diagram showing a configuration example of a semiconductor device (power module) according to a second embodiment.

FIG. 3 is a block diagram showing a configuration example of a semiconductor device (power module 2) according to a second embodiment. A signal line includes at least one signal wire but any bus is not shown in the block diagram. This configuration is identical to those of other block or circuit diagrams of the present application. Characters following "Q" of a power device denote individual devices, whereas "Q" alone denotes at least one power device as a whole. Additionally, "D" for a diode and "S" for a sensor are similarly expressed. Regarding sensors S, a temperature sensor "St", a current sensor "Sc", and a voltage sensor "Sv" are also accompanied with characters following "St", "Sc", and "Sv" so as to identify the individual sensors, whereas at least one temperature sensor, current sensor, and voltage sensor are denoted as "St", "Sc", and "Sv", respectively.

The power module 2 is coupled to a rectified direct-current power supply (P is a positive electrode and N is a negative electrode) that is supplied from a rectifying circuit including a three-phase alternating-current power supply 11 and diodes D_1 to D_6. The power module 2 drives the load 12 in response to three-phase signals U, V, and W. The rectified power supply further includes a protection circuit composed of an IGBT (Q1) and a diode D_7. The power module 2 is coupled to a control board 9 including a control micro-controller unit (MCU) 8 and drives the load 12 in response to an instruction from a user. In this case, "instruction from a user" is an instruction provided by some method, for example, a manual instruction through a user interface (not shown), an instruction from another device, or a programmed instruction. The programmed instruction is obtained by autonomously controlling the control board 9 according to a prepared program. The control board 9 may include a network interface 13 coupled to the control MCU 8. The network interface 13 communicates with an external network 14 coupled to the network interface 13. The network 14 may be any network, for example, a controller area network (On-board network; CAN), a local area network (LAN) in a factory, or the Internet.

The power module 2 includes an IGBT module 1 composed of six IGBTs (Quh, Qvh, Qwh, Qul, Qvl, Qwl), a drive circuit 3, a control circuit 4, and a measuring circuit 5. The IGBTs (Quh, Qvh, Qwh, Qul, Qvl, and Qwl) are respectively coupled to protection diodes Duh, Dvh, Dwh, Dul, Dvl, and Dwl and have sensors Suh, Svh, Swh, Sul, Svl, and Swl. The sensors Suh, Svh, Swh, Sul, Svl, and Swl are, for example, temperature sensors and PN junction diodes formed on the same chip s the IGBTs. The temperature sensors do not always need to be contained in the IGBTs. Discrete components attached to the IGBTs may be used instead. For example, the sensors Suh, Svh, Swh, Sul, Svl, and Swl may be GMR sensors for measuring the collector currents of the IGBTs. Alternatively, the temperature sensors and the GMR sensors may be installed.

The six IGBTs (Quh, Qvh, Qwh, Qul, Qvl, and Qwl) are categorized into the three high-side IGBTs (Quh, Qvh, and Qwh) coupled to the positive electrode P and the three low-side IGBTs (Qul, Qvl, and Qwl) coupled to the negative electrode N. The three-phase signals U, V, and W for driving the load 12 are each driven by an inverter including two of the IGBTs. The signal U is driven by an inverter including the two IGBTs Quh and Qul, the signal V is driven by an inverter including the two IGBTs Qvh and Qvl, and the signal W is driven by an inverter including the two IGBTs Qwh and Qwl. The gate electrodes of the IGBTs are driven by the drive circuit 3 in response to, for example, a pulse width modulation (PWM) signal. The six IGBTs (Quh, Qvh, Qwh, Qul, Qvl, and Qwl) may each have a parallel coupling of multiple IGBTs, that is, the IGBTs in multiples of 6.

The sensors Suh, Svh, Swh, Sul, Svl, and Swl are coupled to the proper measuring circuit 5. The measurement results are inputted to the control circuit 4. The drive circuit 3 and the control circuit 4 are coupled to couplers 10_1 and 10_2 that can communicate with the control MCU 8 on the control board 9. The couplers 10_1 and 10_2 are, for example, photocouplers that can electrically isolate the module 2 from the control board 9. The control MCU 8 on the control board 9 may be contained in the power module 2. In this case, the need for the couplers 10_1 and 10_2 can be eliminated.

Figure 4:
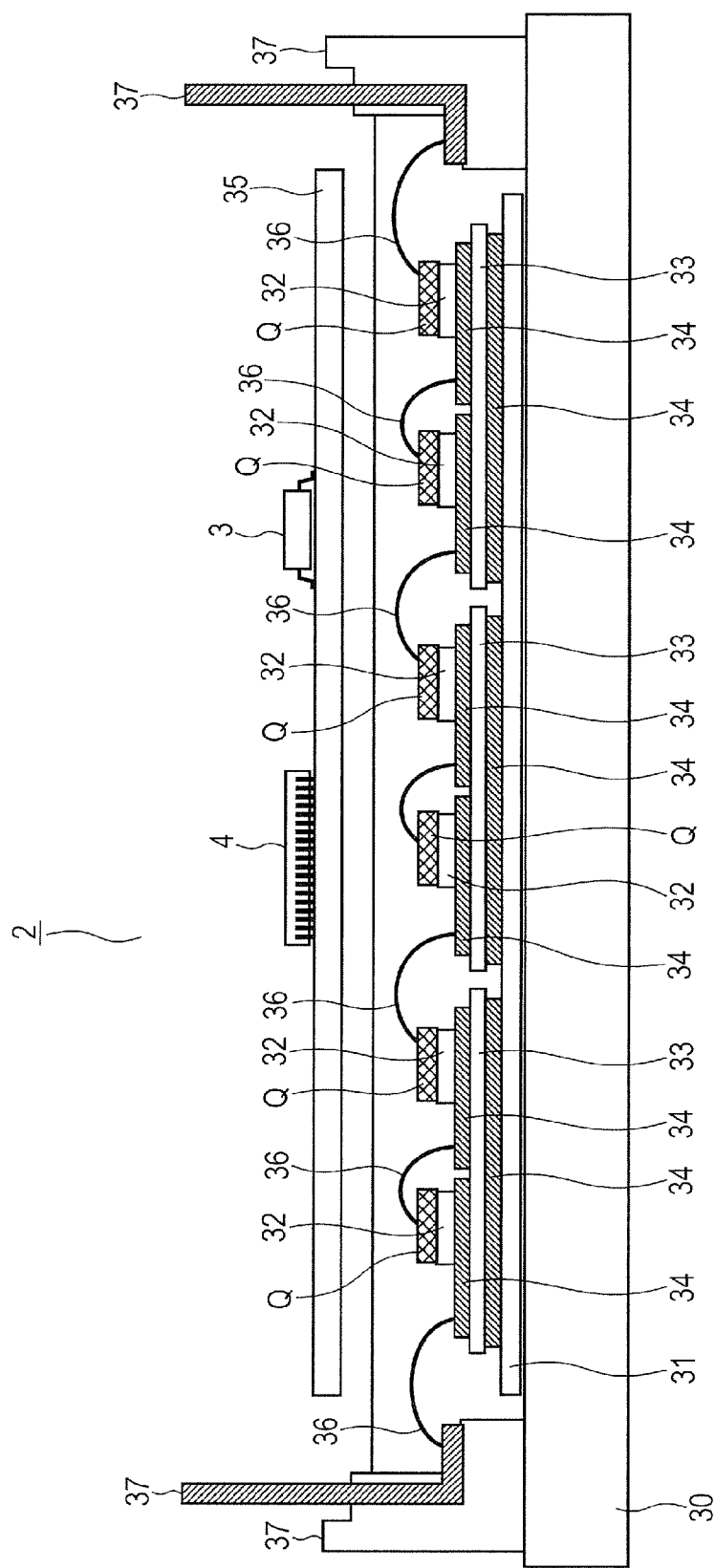
FIG. 4 is a schematic cross-sectional view showing a mounting example of the semiconductor device (power module 2) according to the second embodiment.

FIG. 4 is a schematic cross-sectional view showing a mounting example of the semiconductor device (power module 2) according to the second embodiment.

The back side of the power device (IGBT)Q is electrically coupled via solder 32 to a metal pattern 34 formed on an insulating substrate 33. The power device (IGBT) Q corresponds to the six IGBTs (Quh, Qvh, Qwh, Qul, Qvl, and Qwl) shown in FIG. 3 but FIG. 4 does not correctly reflect electrical coupling. Wiring is installed with bonding wires 36 on electrodes formed on the surface of the power device (IGBT)Q. The metal pattern 34 on the back side of the insulating substrate 33 is soldered to a metal base 31, and a heat sink 30 is attached to the metal base 31. A In a housing 37, power lines P and N are provided and power is supplied to the power devices (IGBTs)Q via, for example, the bonding wires 36. The drive circuit 3 and the control circuit 4 are integrated circuits that are mounted on a circuit board 35. Between the circuit board 35 and the power devices (IGBTs) Q, other wires for the driving signal, the sensors, and the measuring circuit 5 are provided. These wires are not shown. If the metal base 31 can sufficiently dissipate heat, the heat sink 30 is omitted. Alternatively, the heat sink 30 may act as the metal base 31.

Heat generated in the power device (IGBT) Q is transmitted to the heat sink 30 through the solder 32, the insulating substrate 33, the metal patterns 34 formed on both surfaces of the insulating substrate 33, solder between the metal pattern 34 on the back side and the metal base 31, the metal base 31, and an adhesive layer between the metal base 31 and the heat sink 30. A thermal conduction path from the power device (IGBT)Q to the metal base 31 has a resistance. A noticeable fault of the power module 2 is caused by the life of a power cycle in a fault mode in which the solder 32 is peeled off from the back side of the power device (IGBT)Q. At this point, the peeling of the solder 32 reduces the electrical conduction of the power device (IGBT)Q, losing the function of the power module 2. In a process of the occurrence of a fault caused by the life of a power cycle, the solder 32 is gradually peeled off while a thermal resistance gradually increases. In the second embodiment, instead of conventional life prediction based on the number of power cycles, an increase in thermal resistance is monitored and a fault caused by exfoliation of solder is mainly detected beforehand.

The fault detecting method according to the first embodiment is mainly realized as the function of the control circuit 4.

Figure 5:
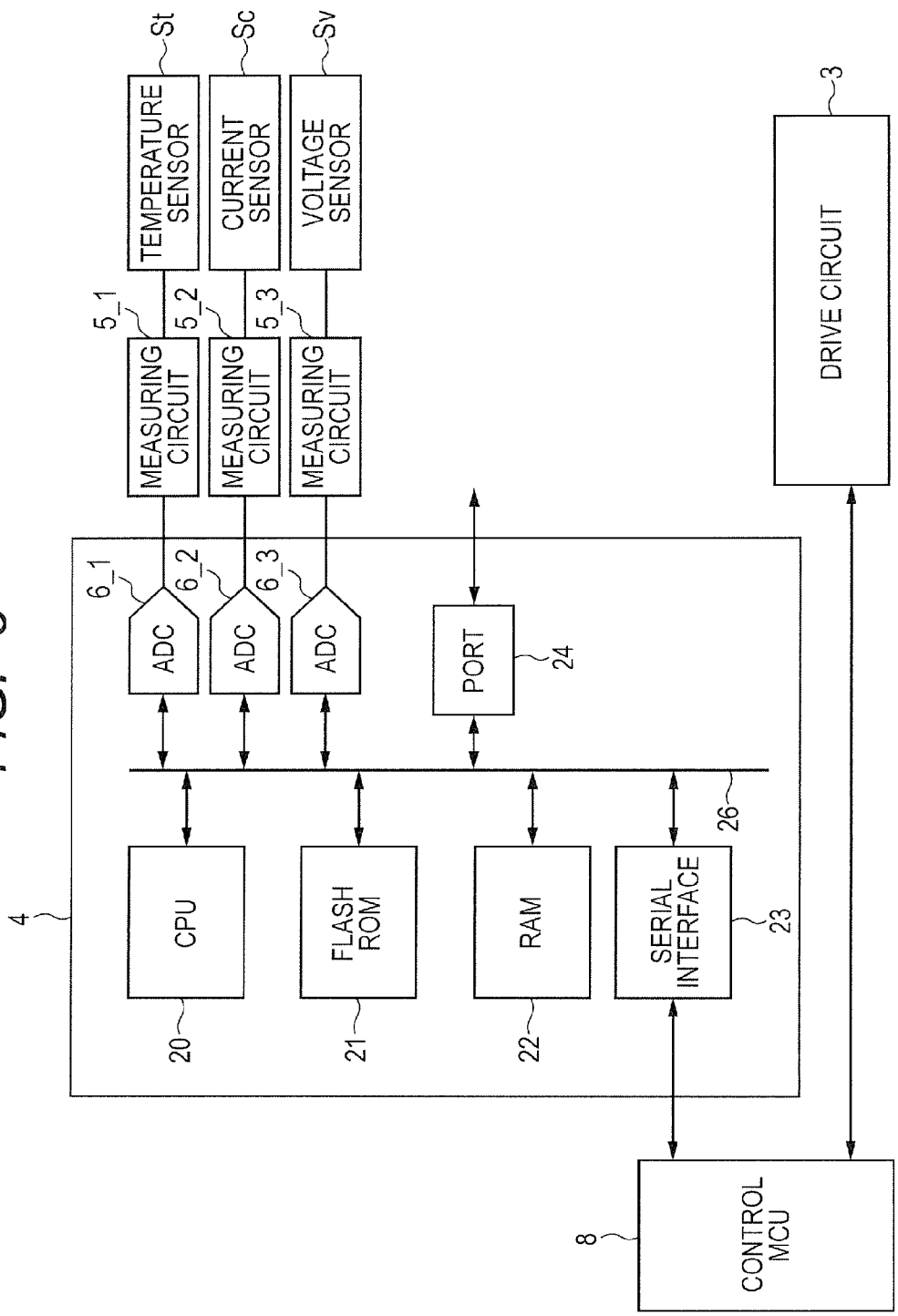
FIG. 5 is a block diagram showing a configuration example of a control circuit 4.

FIG. 5 is a block diagram showing a configuration example of the control circuit 4. The control circuit 4 includes a CPU 20, flash ROM 21 and RAM 22, a serial interface 23, input/output port 24, and A/D converters (ADC) 6_1 to 6_3 that are coupled to one another via a bus 26. The serial interface 23 is a communication interface coupled to the control MCU 8, which is a host MCU, to perform serial communications. The control MCU 8 supplies a pulse width modulating signal for generating a driving signal outputted from the drive circuit. Instead, the control circuit 4 may contain, for example, a pulse-width modulation circuit module coupled to the bus 26 so as to be coupled to the drive circuit 3. The A/D converters (ADCs) 6_1 to 6_3 are respectively coupled to the temperature sensor St, the current sensor Sc, and the voltage sensor Sv via measuring circuits 5_1 to 5_3 so as to convert measured values to digital values. FIG. 5 schematically shows the three sensors, the three measuring circuits, and the three ADCs. Actually, any number of sensors, measuring circuits, and ADCs may be mounted. For example, the temperature sensors St may be mounted for the respective six IGBTs shown in FIG. 3. Thus, the total number of the temperature sensors S may be six. At this point, the six measuring circuits and the six ADCs may be provided for the respective temperature sensors or the single ADC may be operated with additional multiplexer in a time-sharing manner. The number of current sensors Sc and the number of measuring circuits 5_2 and ADCs 6_2 for the current sensors Sc are similarly set. The voltage sensor Sv does not always indicate a component sensor as described above. Any number of measuring circuits 5_3 and ADC 6_3 may be provided like the temperature sensors S. Specifically, the measuring circuits and ADCs may be respectively provided for the six IGBTs shown in FIG. 3. The six measuring circuits and the six ADCs may be provided in total or the single ADC may be operated with additional multiplexer in a time-sharing manner.

Figure 6:
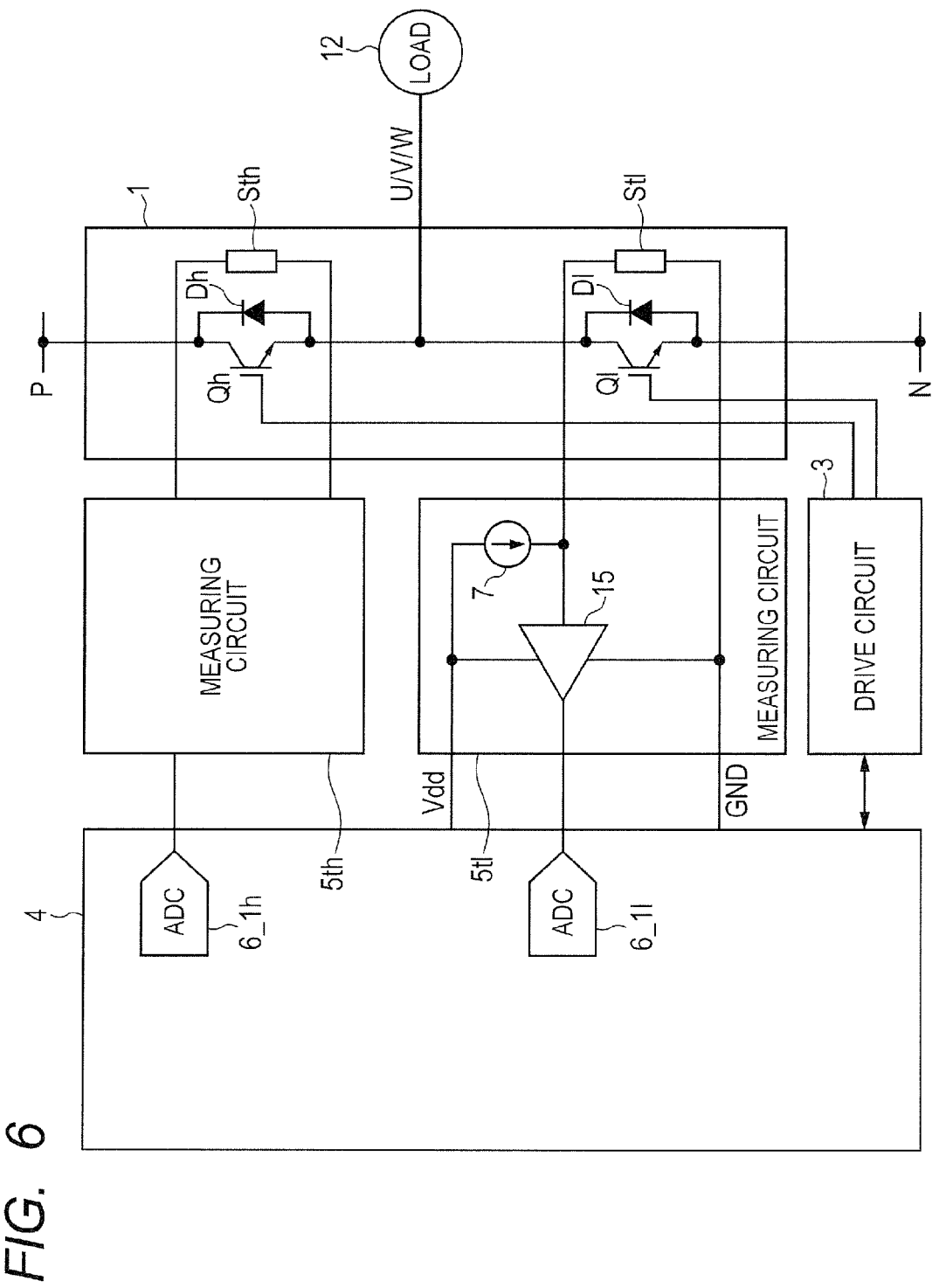
FIG. 6 is a circuit diagram schematically illustrating the configuration and coupling of temperature sensors, measuring circuits, and ADCs.

FIG. 6 is a circuit diagram schematically illustrating the configuration and coupling of the temperature sensors St, the measuring circuits 5_1, and the ADCs 6_1. In the power module 2 of FIG. 3, it is assumed that the temperature sensors are mounted for the respective IGBTs. This circuit is shown as a representative circuit for one of three phases U/V/W. In the IGBT module 1, the single inverter including a high-side IGBT (Qh) and a low-side IGBT (Ql) is shown and other inverters are omitted. The two IGBTs (Qh and Ql) are coupled in parallel with protection diodes Dh and Dl, respectively. The IGBTs receive a driving signal from the drive circuit 3 and the outputs of the IGBTs are coupled to the load 12. The temperature sensors Sth and Stl are provided in or in contact with the two IGBTs (Qh and Ql), respectively. The measuring circuits 5th and 5tl are measuring circuits for temperature measurement and each include a current source 7 and an amplifier 15. The measuring circuits 5th and 5tl are coupled to the two high-side and low-side temperature sensors Sth and Stl, respectively. For example, the control circuit 4 is configured as shown in FIG. 5 and has two ADCs 6_1h and 6_1l for the two high-side and low-side temperature sensors Sth and Stl, respectively. The low side will be first discussed below. The temperature sensor Stl is, for example, a PN junction diode that receives a constant current passing from the current source 7 of the measuring circuit 5tl in a forward direction. The amplifier 15 amplifies a forward voltage at that time and outputs the voltage to the ADC 6_1l. The high-side measuring circuit 5hl is similarly configured and outputs measurement results to the ADC 6_1h. If the temperature sensors Sth and Stl are isolated from each other at a withstand voltage sufficiently higher than a high voltage in the IGBT module 1, the measuring circuits 5th and t5tl can operate with Vdd and GND that are the power supply voltages of the control circuit 4. If temperature sensors Sth and Stl are not isolated from each other at a high voltage in the IGBT module 1, the high-side measuring circuit 5th has, for example, a level shifter that absorbs a potential difference.

Figure 7:
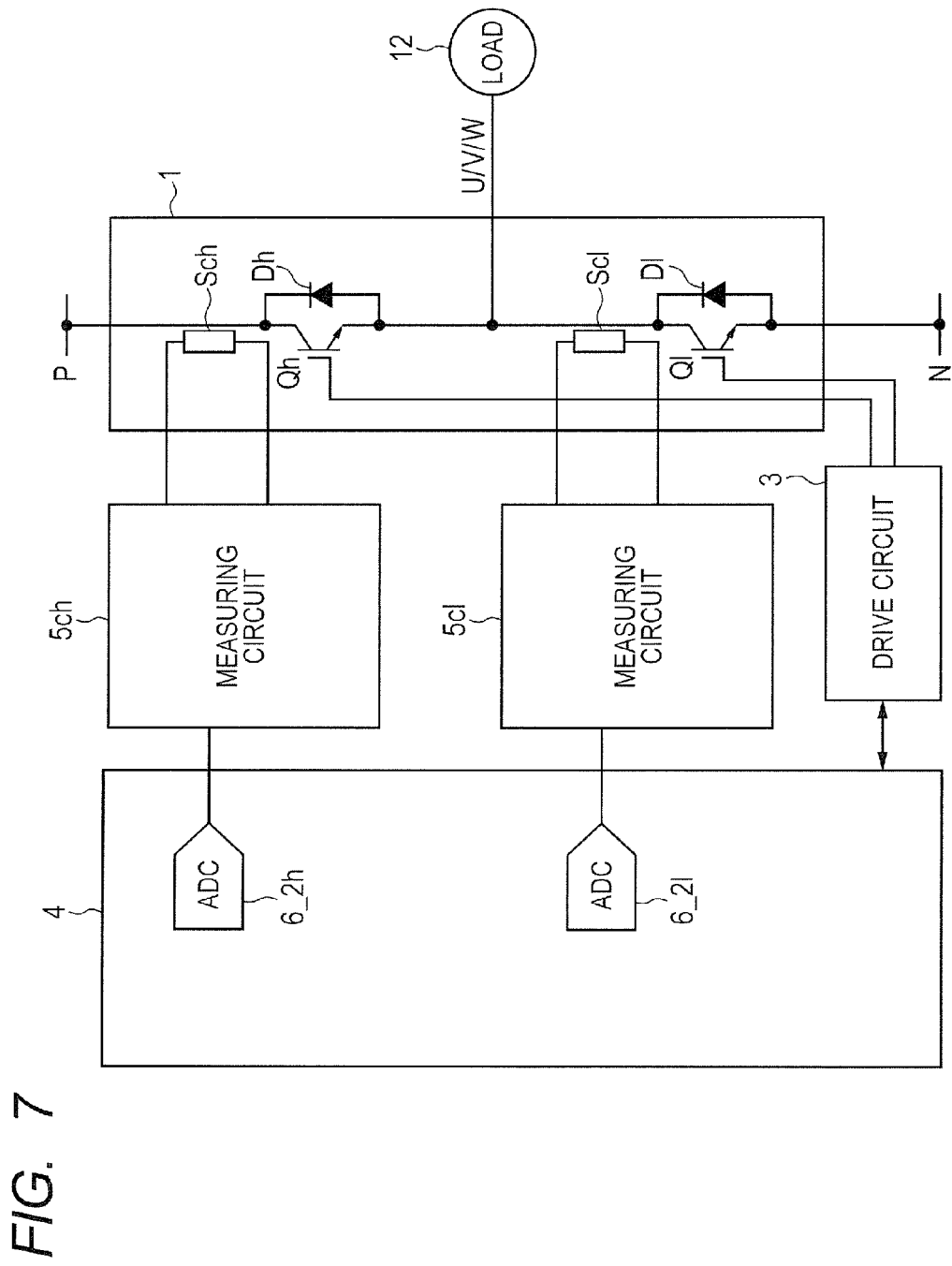
FIG. 7 is a circuit diagram schematically illustrating the configuration and coupling of current sensors, measuring circuits, and ADCs.

FIG. 7 is a circuit diagram schematically showing the configuration and coupling of the current sensor Sc, the measuring circuit 5_2, and the ADC 6_2 in FIG. 5. In the power module 2 of FIG. 3, it is assumed that the current sensors are mounted for the respective IGBTs. As in FIG. 6, this circuit is shown as a representative circuit for one of three phases U/V/W. In the IGBT module 1, the single inverter including the high-side IGBT (Qh) and the low-side IGBT (Ql) is shown and other inverters are omitted. The two IGBTs (Qh and Ql) are coupled in parallel with the protection diodes Dh and Dl, respectively. The IGBTs receive a driving signal from the drive circuit 3 and the outputs of the IGBTs are coupled to the load 12. The current sensors Sch and Scl are, for example, magnetic sensors such as a GMR sensor and are provided along wiring to the collectors of the two high-side and low-side IGBTs (Qh and Ql). The measuring circuits 5ch and 5cl are measuring circuits for magnetic sensors. For example, the control circuit 4 is configured as shown in FIG. 5 and has two ADCs 6_2h and 6_2l for the two high-side and low-side temperature sensors Sch and Scl, respectively. The current sensors Sch and Scl may be provided on an emitter side. The magnetic sensors such as a GMR sensor may be replaced with resistors inserted in series on a collector-emitter current path. In this case, the measuring circuits 5ch and 5cl are configured as voltage measuring circuits that measure a voltage drop across an inserted resistor. Since the voltage drop is proportionate to a collector-emitter current, the voltage value of voltage drop is amplified and then is converted to a digital value in the ADCs 6_2h and 6_2l as a collector current of the IGBT.

Figure 8:
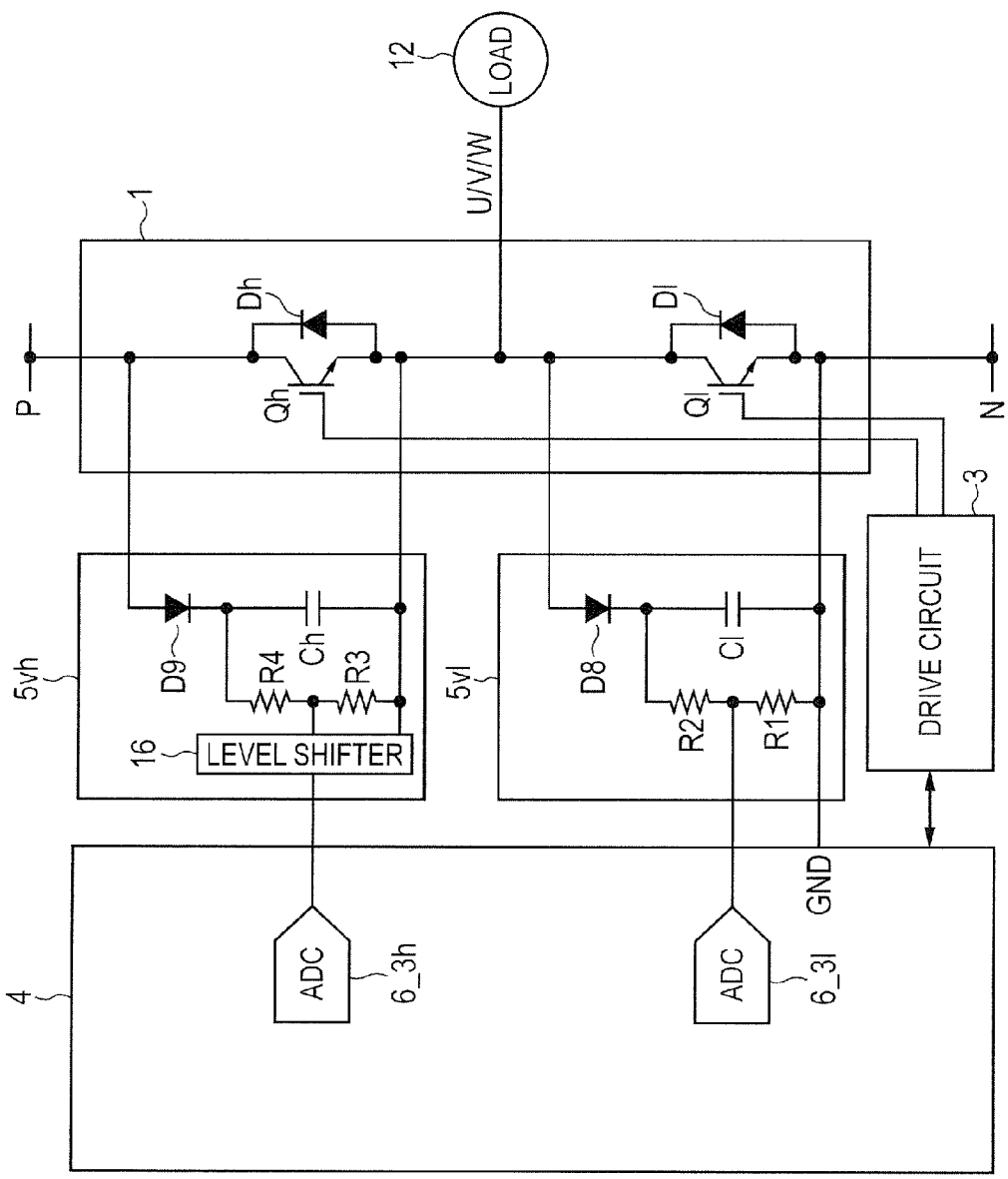
FIG. 8 is a circuit diagram schematically illustrating the configuration and coupling of the measuring circuit for measuring the off voltages of the IGBTs, and ADCs.

FIG. 8 is a circuit diagram schematically illustrating the configuration and coupling of the measuring circuit for measuring the off voltages of the IGBTs, and the ADCs. The circuit diagram corresponds to the voltage sensor Sv, the measuring circuit 5_3, and the ADC 6_3 of FIG. 5. In the power module 2 of FIG. 3, it is assumed that the current sensors are mounted for the respective IGBTs. As in FIG. 6, this circuit is shown as a representative circuit for one of three phases U/V/W. In the IGBT module 1, the single inverter including the high-side IGBT (Qh) and the low-side IGBT (Ql) is shown and other inverters are omitted. The two IGBTs (Qh and Ql) are coupled in parallel with the protection diodes Dh and Dl, respectively. The IGBTs receive a driving signal from the drive circuit 3 and the outputs of the IGBTs are coupled to the load 12. The measuring circuits 5vh and 5vl are circuits for measuring a collector-emitter voltage VCE_OFF (off voltage) when the two IGBTs (Qh and Ql) are turned off. For example, the control circuit 4 is configured as shown in FIG. 5 and has two high-side and low-side ADCs 6_3h and 6_3l. The low side will be first discussed below. The measuring circuit 5vl on the low side includes a diode D8 with an anode coupled to the collector of the IGBT (Ql), a capacitor Cl coupled in parallel between the cathode of the diode D8 and the emitter of the IGBT (Ql), and series resistors R1 and R2. A collector-emitter voltage VCE_OFF of the IGBT (Ql) is rectified by the diode D8, is smoothed by the capacitor Cl, is divided by the series resistors R1 and R2, and is outputted to the ADC 6_3l. Also on the high side, the measuring circuit 5vh includes a diode D9 with an anode coupled to the collector of the IGBT (Qh), a capacitor Ch coupled in parallel between the cathode of the diode D9 and the emitter of the IGBT (Qh), and series resistors R3 and R4. The measuring circuit 5vh on the high side further includes a level shifter 16. A collector-emitter voltage VCE_OFF of the IGBT (Qh) is rectified by the diode D8, is smoothed by the capacitor Ch, is divided by the series resistors R3 and R4, is level-shifted by the level shifter 16, and then is outputted to the ADC 6_3h. The emitter potential of the IGBT (Qh) is equal to that of a three-phase signal of U/V/W and has an amplitude between the positive electrode P and the negative electrode N of the power supply of the IGBT, typically leading to a large potential difference from the negative electrode N. In FIG. 8, the low-side measuring circuit 5vl couples the ground potential GND and the negative electrode N of the power supply of the IGBT module 1 so as to obtain a reference potential. Thus, in the high-side measuring circuit 5vh, the level shifter 16 shifts a GND level to a potential serving as the reference potential and then outputs the potential.

Figure 9:
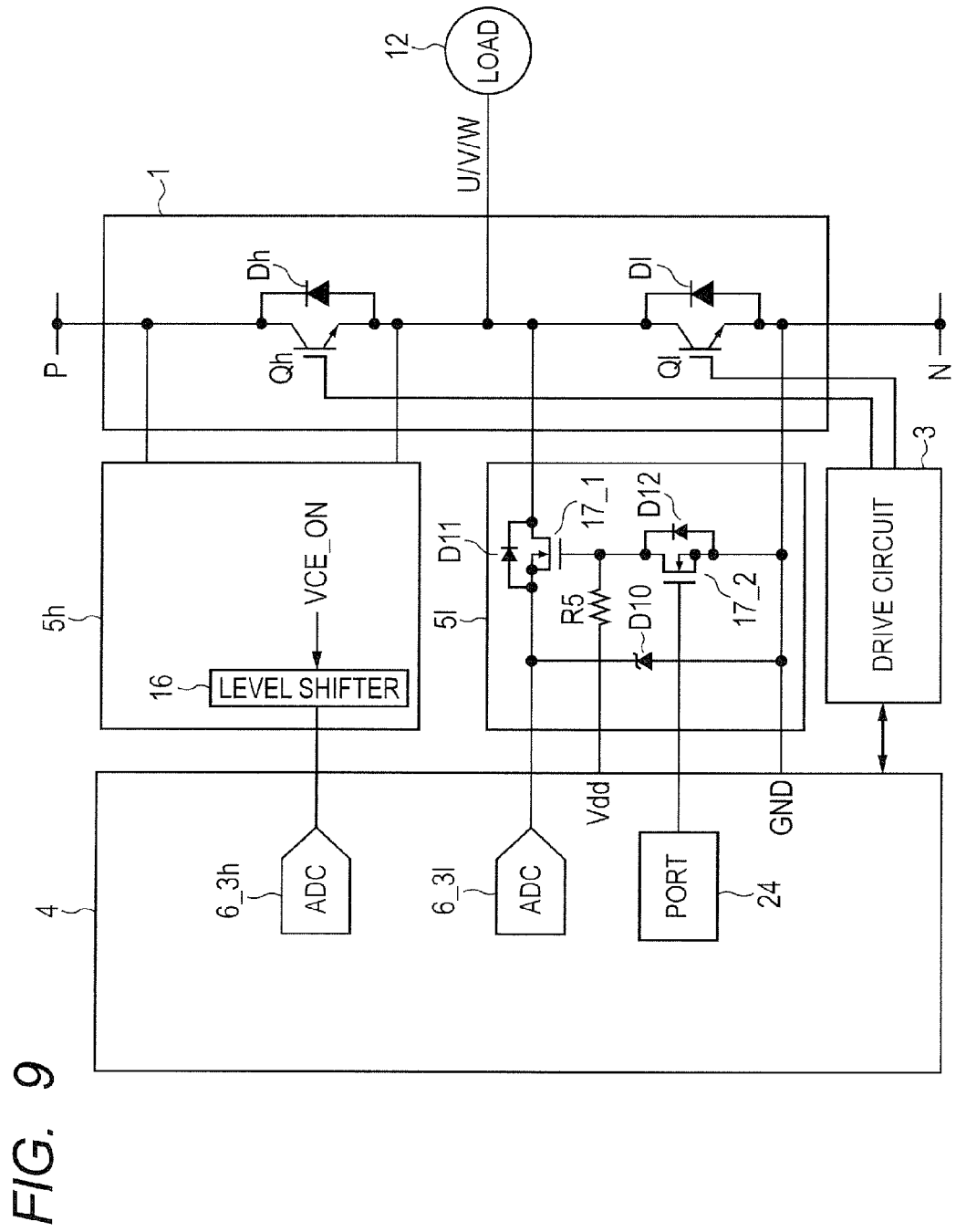
FIG. 9 is a circuit diagram schematically illustrating the configuration and coupling of the measuring circuit for measuring the on voltages of the IGBTs, and the ADCs.

FIG. 9 is a circuit diagram schematically illustrating the configuration and coupling of the measuring circuit for measuring the on voltages of the IGBTs, and the ADCs. As in FIG. 8, FIG. 9 corresponds to the voltage sensor Sv, the measuring circuit 5_3, and the ADC 6_3 of FIG. 5. In the power module 2 of FIG. 3, it is assumed that the current sensors are mounted for the respective IGBTs. As in FIG. 8, this circuit is shown as a representative circuit for one of three phases U/V/W. In the IGBT module 1, the single inverter including the high-side IGBT (Qh) and the low-side IGBT (Ql) is shown and other inverters are omitted. The two IGBTs (Qh and Ql) are coupled in parallel with the protection diodes Dh and Dl, respectively. The IGBTs receive a driving signal from the drive circuit 3 and the outputs of the IGBTs are coupled to the load 12. The measuring circuits 5vh and 5vl are circuits for measuring a collector-emitter voltage when the two IGBTs (Qh and Ql) are turned on. For example, the control circuit 4 is configured as shown in FIG. 5 and has two high-side and low-side ADCs 6_3h and 6_3l. The low side will be first discussed below. The measuring circuit 5vl on the low side includes two MOSFETs 17_1 and 17_2, protection diodes D11 and D12, a resistor R5, and a Zener diode D10 for protecting the ADC. The MOSFET 17_1 is coupled between the collector of the IGBT (Ql) and the ADC 6_3l and acts as a switch. The MOSFET 17_2 is coupled between the gate electrode of the MOSFET 17_1 and the ground potential GND, and the gate electrode of the MOSFET 17_1 is pulled up to the power supply Vdd by the resistor R5. The gate of the MOSFET 17_2 is coupled to an output port of a PORT 24 of the control circuit 4. The control circuit 4 causes a high-level output from the output port to turn on the MOSFET 17_2 and sets the gate of the MOSFET 17_1 at a low level to turn off the MOSFET 17_1. The control circuit 4 outputs a low level from the output port so as to turn off the MOSFET 17_2 in synchronization with the on period of the IGBT (Ql), and applies a high level to the gate of the MOSFET 17_1 through the resistor R5 so as to turn on the MOSFET 17_1. The control circuit 4 then inputs the collector potential of the IGBT (Ql) to the ADC 6_3l. The Zener diode D10 at this point is a protective element that prevents the ADC 6_3l from receiving a voltage higher than expected. The MOSFET 17_1 inputs the collector potential of the IGBT (Ql) to the ADC 6_3l in synchronization with the on period of the IGBT (Ql), allowing the ADC 6_3l to measure the on voltage VCE_ON of the IGBT (Ql). The measuring circuit 5vh on the high side is similarly configured and further includes the level shifter 16. The measured on voltage VCE_ON of the IGBT (Ql) is level-shifted to a potential with the GND level serving as the reference potential, and then is outputted to the ADC 6_3h. Moreover, a signal for controlling a switch MOS for the MOSFET 17_2 is coupled to another level shifter.

The operation of the control circuit 4 in FIG. 5 will be more specifically described below. The CPU 20 performs the fault detecting method in FIG. 1 by executing a program stored in the flash ROM 21. The measurement of a state of the IGBT acting as a power device immediately before driving is, for example, temperature measurement conducted by the temperature sensor St. The measurement result to be obtained is converted into a digital value by the ADC 6_1. The temperatures of the six IGBTs (Quh, Qvh, Qwh, Qul, Qvl, and Qwl) can be measured using the measuring circuit of FIG. 6. The measurement result obtained immediately before driving is written and stored into the RAM 22. Subsequently, a driving signal for driving the IGBT is outputted from the control MCU 8 through the drive circuit 3 for a predetermined driving period. The driving is a so-called test sequence that is designed so as to set input power Px to the IGBT at a known value. The driving signal for driving the IGBT has a modulated pulse width. The power supply voltage applied to the IGBT and the amplitude, frequency, and duty ratio of the driving signal are properly adjusted so as to set the input power Px to the IGBT at desired power.

A state of the IGBT acting as a power device immediately after driving is measured once again immediately after the driving. This obtains a measurement result immediately after the driving. If the temperatures of the six IGBTs (Quh, Qvh, Qwh, Qul, Qvl, and Qwl) are measured immediately before driving, the temperatures of the six IGBTs are measured also immediately after the driving. A thermal resistance θ is determined by dividing a temperature difference ΔT, which is determined from a difference between measurement results immediately before and after driving, by the input power Px. If it is assumed that the same test sequence is performed every time, it is possible to detect that the thermal resistance θ has exceeded a specified value in response to detection of the temperature difference ΔT exceeding a certain value. In this case, the certain value is a specified value for the temperature difference ΔT and is obtained by multiplying the specified value for the thermal resistance θ by the input power Px. The specified value can be obtained based on a design value. The temperature difference ΔT may be measured at the shipment or the first operation of the power module 2 and may be written and stored in the flash ROM 21 as an initial value, and then the specified value may be calculated based on the initial value. The temperatures of the six IGBTs (Quh, Qvh, Qwh, Qul, Qvl, and Qwl) are each measured, thereby improving the accuracy of fault detection. If the single temperature sensor is arranged substantially at an intermediate position of the six IGBTs so as to measure a mean temperature, even an extremely large temperature difference in the IGBT may reduce the accuracy of detection due to averaging. Furthermore, the temperature sensor shared by the IGBTs is arranged at an intermediate position of the IGBTs and thus measures a temperature between the IGBT and the metal base 31 in the thermal resistor to be monitored. For this reason, higher accuracy of measurement cannot be expected. Moreover, the temperature sensor included in or attached to each of the IGBTs measures a temperature between the metal base 31 and the IGBT in the thermal resistor to be monitored. Thus, the accuracy of measurement can be improved.

Third Embodiment

In the second embodiment, the test sequence is provided to supply the predetermined input power Px to the IGBT. In a third embodiment, the test sequence is replaced with any period serving as a driving period in a normal operation of a power module 2, temperatures are measured immediately before and after the period to determine a temperature difference $\Delta T$, an input power Pz inputted to an IGBT during the driving period is measured, and then it is decided whether a thermal resistance $\theta$ has exceeded the specified value or not based on the temperature difference $\Delta T$ and the input power Pz.

Figure 10:
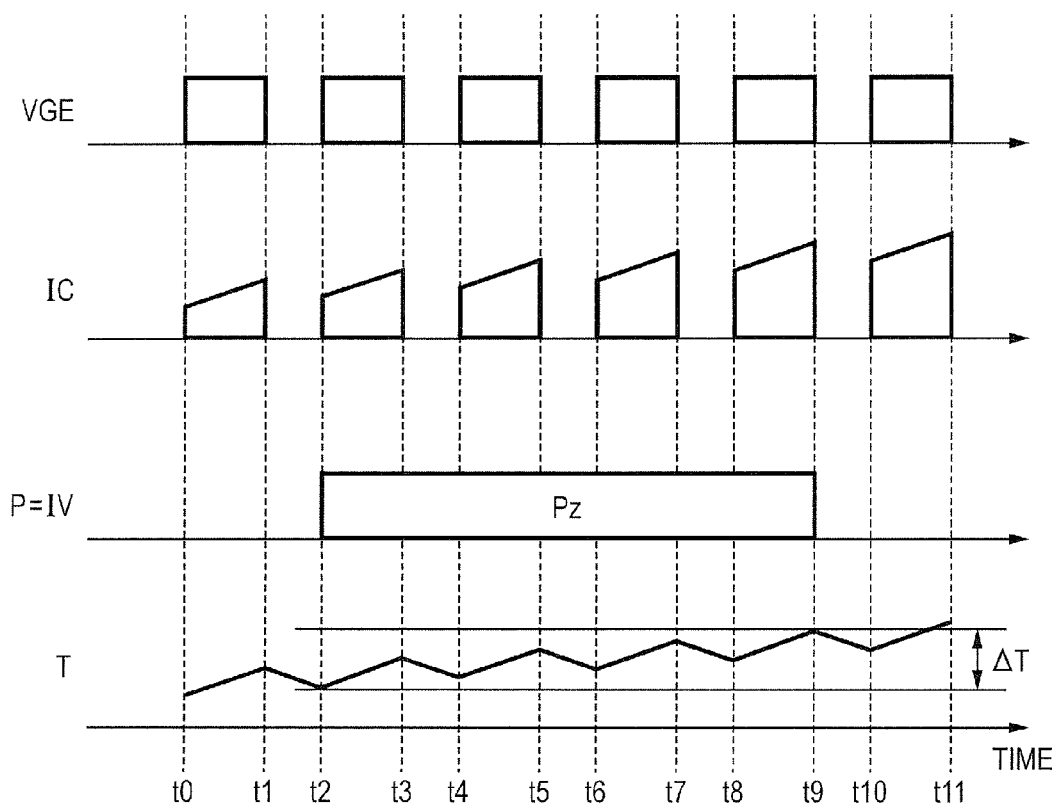
FIG. 10 is a timing chart showing a measuring operation of input power Pz according to a third embodiment.

FIG. 10 is a timing chart showing a measuring operation of the input power Pz. The horizontal indicates a time. In the vertical direction, an IGBT gate-emitter voltage VGE of a driving signal, an IGBT collector current IC, an input power Pz, and a temperature T are indicated from the top. Reference character VGE denotes a driving signal outputted from a drive circuit 3. An amplitude, a frequency, and a duty in a normal operation is controlled by a control MCU 8 in response to a direct or indirect user instruction. The collector current IC is supplied from a power supply and passes between the collector and emitter of the IGBT in response to the driving signal. The power Pz inputted to the IGBT is calculated by the product of the collector current IC and VGE. The temperature T is measured as in the second embodiment to determine the temperature difference $\Delta T$. FIG. 10 shows an example in which the driving period ranges from time t2 to time t9. The driving period is optionally set in a normal operation. The accuracy of detection can be improved with the temperature difference $\Delta T$. Temperatures are measured at time t2 and time t9 to determine the temperature difference $\Delta T$. The thermal resistance $\theta$ is calculated by dividing the temperature difference $\Delta T$ by the power Pz. It is decided whether the calculated thermal resistance $\theta$ has exceeded a predetermined and specified value or not. When the thermal resistance $\theta$ has exceeded the value, an abnormality is detected. The specified value may be calculated from the designed value. Alternatively, a thermal resistance $\theta$ may be calculated at the shipment or the first operation of the power module 2 and may be written and stored in a flash ROM 21 as an initial value, and then the specified value may be calculated based on the initial value.

The temperature T can be measured using temperature sensors Sth and Stl and measuring circuits 5th and 5tl that are shown in FIG. 6. The collector current IC can be measured using current sensors Sch and Scl and measuring circuits 5ch and 5cl that are shown in FIG. 7. Other sensors and other measuring circuits may be used.

Figure 11:
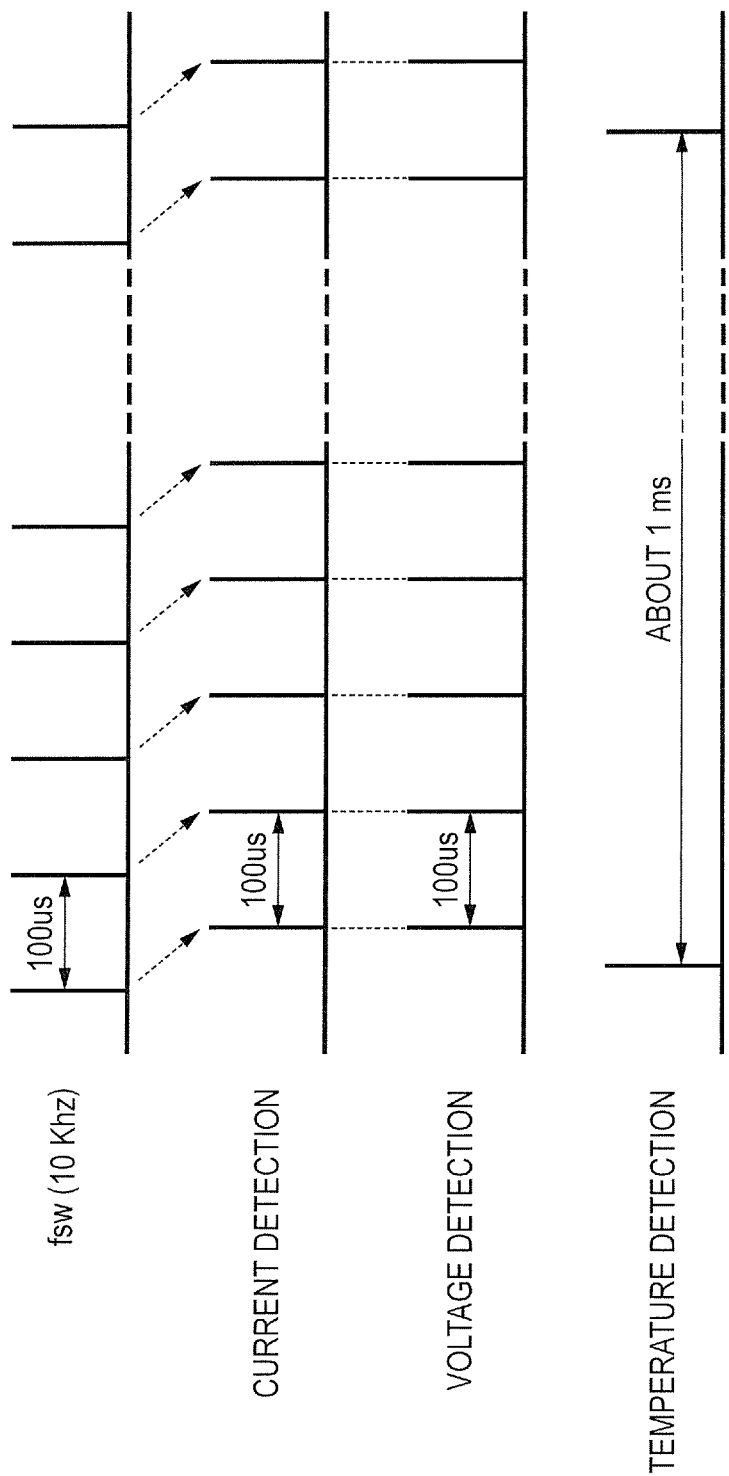
FIG. 11 is an explanatory drawing showing the timing of capturing measurement parameters.

FIG. 11 is an explanatory drawing showing the timing of capturing measurement parameters. The horizontal axis indicates a time. In the vertical direction, switching timing fsw of a driving signal is indicated, and the timing of capturing current detection, voltage detection, and temperature detection is sequentially indicated. At a switching frequency of 10 kHz, the period of the switching timing fsw is 100 µs. Current detection and voltage detection are captured in synchronization with the switching timing fsw of the driving signal after a certain stabilization time from driving. The temperature detection does not need to be synchronized with the switching timing fsw. The temperature detection can be periodically captured at intervals of, for example, 1 ms.

Fourth Embodiment

In the examples of the second and third embodiments, the temperature sensor St arranged in the IGBT module 1 measures a temperature of the IGBT and determines the temperature difference $\Delta T$. In a fourth embodiment, a temperature is determined by the electric characteristics of an IGBT instead of a temperature sensor. The electric characteristics of semiconductor elements such as an IGBT have temperature dependence.

Figure 12:
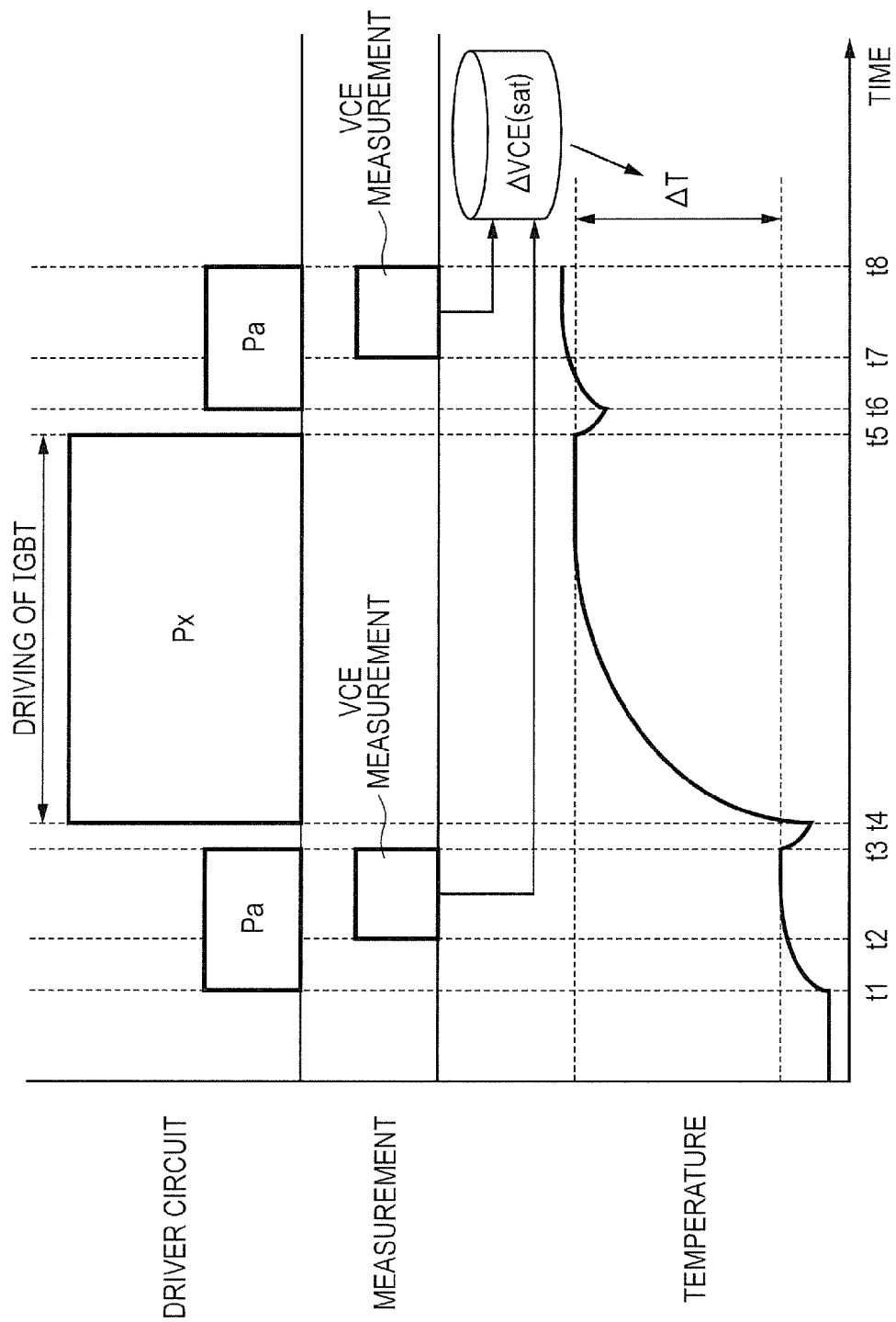
FIG. 12 is a timing chart of an operation example in which a temperature difference is determined from the electric characteristics of an IGBT.

FIG. 12 is a timing chart of an operation example in which a temperature difference is determined from the electric characteristics of an IGBT. The horizontal axis indicates a time. In the vertical direction, an operation of a driver circuit 3, a measuring operation, and a temperature of the IGBT are schematically shown from the top. A period from time t4 to t5 is step S2 for driving a power device in FIG. 1. FIG. 12 shows an example in which input power Px is supplied by a test sequence as in the second embodiment. The following configuration may be used: an input power Pz inputted to the IGBT in the period of time t4 to t5 may be measured as in the third embodiment and then it is decided whether a thermal resistance $\theta$ has exceeded a specified value or not based on a temperature difference $\Delta T$ and the input power Pz.

In the fourth embodiment, VCE of the IGBT is measured as an aspect of measurement of a state of the power device immediately before and after driving, and then the temperature difference $\Delta T$ is calculated from measurement results immediately before and after driving. In a period from time t1 to t3 and a period from time t6 to t8, the conditions for measurement of VCE are set. The IGBT is driven under the same condition Pa so as to keep constant an applied gate voltage, a collector voltage, and a collector current. VCE immediately before driving is measured at time t2 to t3 after a stabilization period from the start of driving under the condition Pa, and then VCE immediately after driving is measured at time t7 to t8 after a stabilization time from the start of driving under the same condition Pa. After that, a saturation collector voltage $\Delta$VCE (sat) is determined and then the temperature difference $\Delta T$ is determined.

In the fourth embodiment, VCE of the IGBT was mainly discussed. Other parameters may be used as long as electric characteristics have temperature dependence. This configuration is similarly applicable to power devices other than IGBTs.

Thus, the temperatures of power devices such as an IGBT and a temperature difference can be determined without temperature sensors. Temperature sensors and measuring circuits for the sensors can be omitted. Additionally, the accuracy of measurement can be improved because the temperature of a power device is directly measured.

Fifth Embodiment

Figure 13:
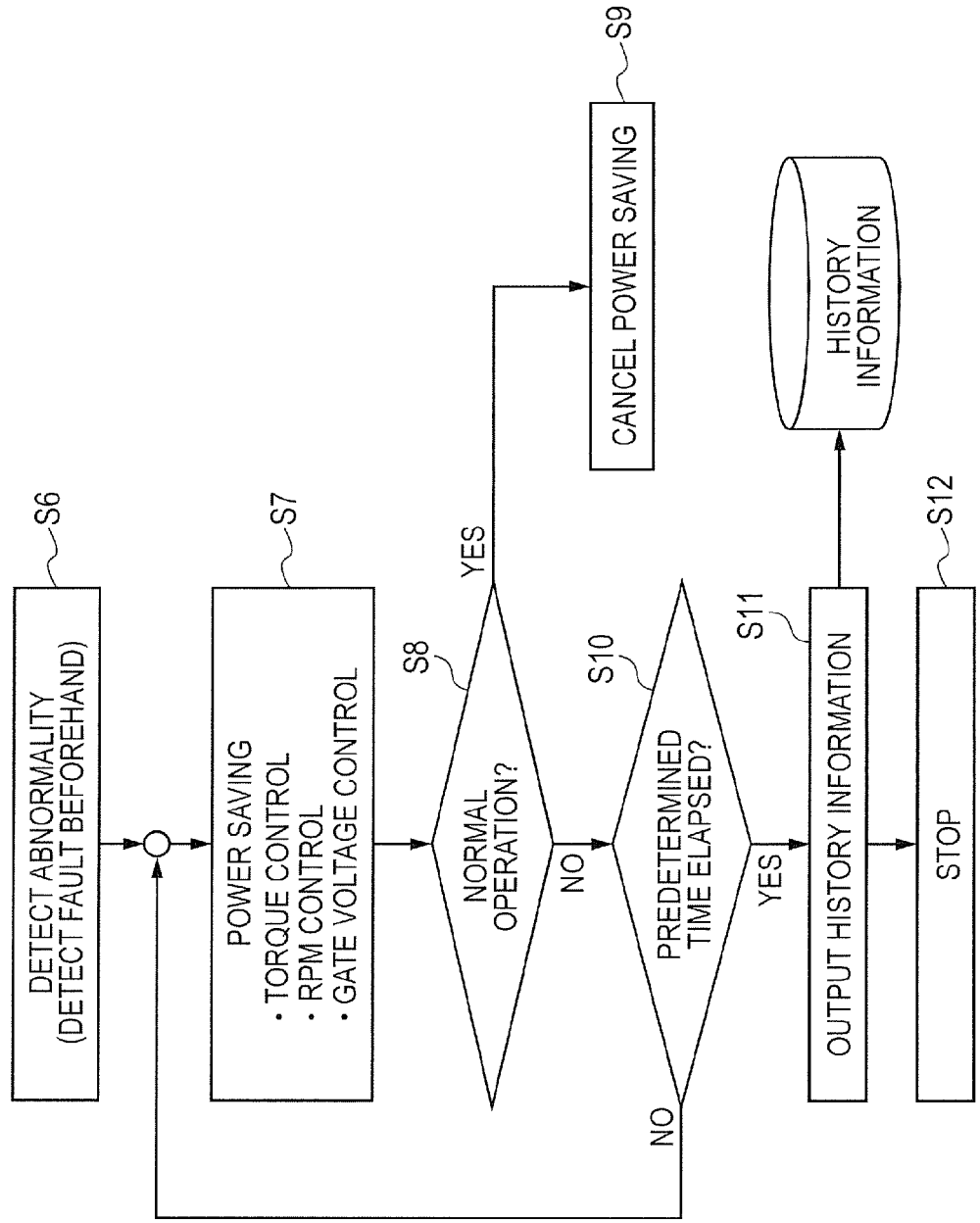
FIG. 13 is a flowchart showing an operation example of a power module after an abnormality is detected.

FIG. 13 is a flowchart showing an operation example of a power module after an abnormality is detected.

For example, in the flowchart of FIG. 1, when an abnormality is detected in the power module 2 (S6), a fault is expected. At this point, a warning about the detection of the abnormality is issued to a manager through a control MCU 8 and repair and replacement are recommended, thereby continuing an operation. Shifting the power module 2 to a power saving operation (S7) can increase a time period before a break (fault) actually occurs. Specifically, for example, the on duties of a driving signal for a power device Q are reduced. If a load is a motor, a torque decreases. For example, the frequency of the driving signal is further reduced. If a load is a motor, the rpm of the motor decreases. For example, the amplitude of the driving signal can be further reduced. This can increase the short-circuit tolerance of the power device. These examples may be implemented separately or in combination.

Subsequently, it is decided whether the power module has returned to a normal operation or not (S8). The decision is made by, for example, detecting an increase in thermal resistance as in FIG. 1. If the power module has returned to a normal operation, a power saving operation is canceled to return to the normal operation (S9). Actually, a thermal resistance increased by deterioration hardly returns to a normal resistance but if an increase in thermal resistance is erroneously detected by an external cause and so on, this method is effective at autonomously returning to a normal operation. If the power module has not returned to a normal operation after a certain time (S10), history information is outputted (S11) to stop the operation of the power module 2 (S12). In this case, the history information concerns, for example, the current, voltage, temperature of the power device Q and the operations of the power module 2. The history information may be written in a flash ROM 21 or the like and outputted therefrom or may be outputted through a host control MCU 8 to a host management system coupled to a network 14. Thus, a state immediately before a fault can be examined later, facilitating analysis of a cause in the event of an actual fault.

The invention made by the inventors was specifically described according to the embodiments. The present invention is not limited to these embodiments and thus needless to say that the present invention can be changed in various ways without departing from the scope of the invention.

For example, these embodiments mainly described a three-phase inverter that has a motor as a load with vertical IGBTs. Replacement with horizontal IGBTs, other power devices, circuits other than an inverter, or loads other than a motor is possible within the scope of the invention, that is, detection of an increase in thermal resistance.

What is claimed is:

1. A semiconductor device, comprising:
   a power device mounted on a metal base;
   a drive circuit for driving the power device;
   a measuring circuit that measures a state of the power device immediately before and after a driving period in which the drive circuit drives the power device; and
   a control circuit that detects, according to a result of the measurement by the measuring circuit, an increase in a thermal resistance between the metal base and the power device based on a temperature difference before and after the driving of the power device and an input power to the power device in the driving period,
   wherein the drive circuit drives the power device in response to a driving signal with pulse width modulation, a condition is specified by a parameter including a duty ratio of the pulse width modulation, and the input power is calculated based on a power supply voltage applied to the power device, an amplitude and a frequency of the driving signal, and the duty ratio, and
   wherein the control circuit detects that the increase in the thermal resistance has reached at least a predetermined value, and then the control circuit reduces at least one of the duty ratio, the amplitude and the frequency of the driving signal to reduce a capability of driving the power device by the drive circuit.

2. The semiconductor device according to claim 1, wherein the control circuit causes the drive circuit to perform the driving on the condition that the input power is set at the predetermined value.

3. The semiconductor device according to claim 1, wherein the measuring circuit measures a voltage applied to the power device and a current passing through the power device in the driving period, and supplies a measurement result to the control circuit, and the control circuit calculates the input power from the measurement result.

4. The semiconductor device according to claim 3, wherein the current includes an on current when the power device is turned on, and the voltage includes an on voltage and an off voltage of the power device.

5. The semiconductor device according to claim 1, wherein the measuring circuit includes a temperature sensor that is provided in or next to the power device, and the temperature difference is calculated from a value measured by the temperature sensor.

6. The semiconductor device according to claim 2, wherein the predetermined value includes a first predetermined value,
   wherein the measurement of the state of the power device by the measuring circuit immediately before and after the driving period involves additional driving of the power device by the drive circuit on a condition that the input power is set at a second predetermined value smaller than the first predetermined value, and
   wherein the control circuit calculates the temperature difference based on a measurement result of the state of the power device by the measuring circuit immediately before and after the driving period.

7. The semiconductor device according to claim 1, wherein the power device includes an insulated gate bipolar transistor.

8. The semiconductor device according to claim 1, wherein the control circuit detects that the increase in the thermal resistance has reached at least the predetermined value, and then the control circuit reduces the capability of driving the power device by the drive circuit.

9. The semiconductor device according to claim 8, wherein the power device includes an insulated gate bipolar transistor, the drive circuit drives, for the power device, a gate electrode of the insulated gate bipolar transistor in response to a driving signal with pulse width modulation.

10. The semiconductor device according to claim 1, wherein the power device mounted is on a metal base through a solder layer disposed on a surface of a metal pattern that is located between the power device and the metal base, and
    wherein the input power is provided to the power device through a wire connected to the surface of the metal pattern.

11. The semiconductor device according to claim 10, wherein, between the power device and the metal base, an insulating substrate is disposed on another surface of the metal pattern and another metal pattern is disposed between the insulating substrate and the metal base, and
    wherein the thermal resistance between the metal base and the power device includes thermal resistances of the power device, the solder layer, the metal pattern, the insulating substrate, said another metal pattern, and the metal base.

12. A method of detecting a fault of a semiconductor device comprising a power device mounted on a metal base and a drive circuit for driving the power device, the method comprising:

measuring a state of the power device immediately before and after a driving period in which the drive circuit drives the power device;

detecting, by a control circuit, according to a result of the measurement, an increase in a thermal resistance between the metal base and the power device based on a temperature difference before and after the driving of the power device and an input power to the power device in the driving period; and detecting the fault of the semiconductor device beforehand based on the increase in the thermal resistance between the metal base and the power device, wherein the drive circuit drives the power device in response to a driving signal with pulse width modulation, a condition is specified by a parameter including a duty ratio of the pulse width modulation, and an amount of electricity is calculated based on a power supply voltage applied to the power device, an amplitude and a frequency of the driving signal, and the duty ratio, and wherein the control circuit detects that the increase in the thermal resistance has reached at least a predetermined value, and then the control circuit reduces at least one of the duty ratio, the amplitude and the frequency of the driving signal to reduce a capability of driving the power device by the drive circuit.

13. The method of detecting a fault according to claim 12, wherein the driving is performed on the condition that the input power is set at the predetermined value, and wherein the increase in the thermal resistance is detected based on the temperature difference and the predetermined value.

14. The method of detecting a fault according to claim 12, wherein a voltage applied to the power device and a current passing through the power device are measured in the driving period, and the input power is calculated from a result of the measurement.

15. The method of detecting a fault according to claim 14, wherein the current includes an on current when the power device is turned on, and the voltage includes an on voltage and an off voltage of the power device.

16. The method of detecting a fault according to claim 12, wherein the semiconductor device includes a temperature sensor that is provided in or next to the power device, and the temperature difference is calculated from a value measured by the temperature sensor.

17. The method of detecting a fault according to claim 13, wherein the predetermined value includes a first predetermined value, wherein the measurement of the state of the power device by the measuring circuit immediately before and after the driving period involves additional driving of the power device by the drive circuit on a condition that the input power is set at a second predetermined value smaller than the first predetermined value, and wherein the temperature difference is calculated based on a measurement result of the state of the power device immediately before and after the driving period.

18. The method of detecting a fault according to claim 12, wherein the power device includes an insulated gate bipolar transistor.

* * * * *